United States Patent [19]

Karban et al.

[11] Patent Number: 4,749,884
[45] Date of Patent: Jun. 7, 1988

[54] LOW POWER, HIGH LEVEL DRIVER

[75] Inventors: Steven H. Karban, Apple Valley; Cleon L. Hennen, Burnsville, both of Minn.

[73] Assignee: Unisys Corporation, Blue Bell, Pa.

[21] Appl. No.: 490,750

[22] Filed: Jun. 10, 1983

Related U.S. Application Data

[63] Continuation of Ser. No. 218,601, Dec. 22, 1980, abandoned.

[51] Int. Cl.$^4$ .................. H03K 17/60; H03K 19/092; H03K 3/01
[52] U.S. Cl. .................................. 307/270; 307/475; 307/296 R
[58] Field of Search ............... 307/475, 270, 264, 297, 307/254, 296.3; 365/222; 364/707

[56] References Cited

U.S. PATENT DOCUMENTS

| | | | |
|---|---|---|---|
| 3,096,447 | 7/1963 | Hill et al. ........................... | 307/254 |
| 3,581,107 | 5/1971 | Nielsen .............................. | 307/475 |
| 3,986,045 | 10/1976 | Lutz ................................ | 307/475 |
| 4,031,413 | 6/1977 | Ohhinata et al. ................... | 365/227 |
| 4,039,862 | 8/1977 | Dingwall et al. ................... | 307/475 |
| 4,104,734 | 8/1978 | Herdon ............................. | 365/227 |

OTHER PUBLICATIONS

National Semiconductor, Inc., Buffers pp. 2-4 to 2-14.

*Primary Examiner*—Stanley D. Miller
*Assistant Examiner*—B. P. Davis
*Attorney, Agent, or Firm*—Glenn W. Bowen; Laurence J. Marhoefer

[57] ABSTRACT

An improved driver interface circuit for interfacing between low voltage, low drive capability logic signals and large capacitive loads requiring high speed, high voltage logic signals. The improvement comprising the use of the logic input signal to power gate a high level buffer contained in the driver and thereby minimize the power consumption during inactive periods.

13 Claims, 3 Drawing Sheets

LOW POWER, HIGH LEVEL DRIVER

This is a continuation of application Ser. No. 218,601, filed Dec. 22, 1980, now abandoned.

BACKGROUND OF THE INVENTION

The present invention relates to driver interface circuits of the type used to interface between logic signals having a low drive capability and large capacitive loads requiring high speed, high voltage drive signals. In particular, the present invention relates to an improved buffer circuit wherein the level shifted logic input is used to power gate the high current buffer during inactive periods and thereby minimize the power consumption of the buffer during the inactive periods.

A common problem encountered by logic circuit designers in many designs is that of having to drive large capacitive loads but only having low voltage, low drive capability logic signals present. This problem becomes especially acute where it is necessary to drive MNOS type devices which require an especially large voltage swing (i.e. approximately 30 volts) between logic states. While buffers such as the hereinafter described National Semiconductor, Inc. Part No. LH 0033 are available to the circuit designer, these buffers generally consume large amounts of power during inactive periods. This large current consumption however, presents a problem in itself to the designer who is additionally faced with power consumption requirements. Therefore, it is the primary objective of the present invention to minimize the amount of power consumed in such an interface circuit during inactive periods of the logic input signal. This objective is achieved via the novel use of the logic input signal to power gate (i.e. switch-off) the high current buffer.

It is an additional objective of the present invention to minimize the amount of circuitry and logic signals necessary to accommodate the power gating objective.

It is a still further objective of the present invention to provide power gating without affecting the buffer's speed, voltage or other drive characteristics.

These objects are achieved in the present invention via the use of the input logic signal as a power gate input to the voltage follower buffer, thereby switching off the buffer during inactive periods and minimizing the concurrent power consumption.

SUMMARY OF THE INVENTION

An improved low power, high level driver interface circuit for driving large capacitive loads with high speed, high voltage signals. The improvement comprising the use of the low level, low drive capability input logic signal to power gate the buffer and thereby minimize the power consumption within the buffer during the inactive periods of the input logic signal.

The interface circuit essentially comprising a voltage comparator (i.e. level shifter), an emitter follower, and a voltage follower buffer. The comparator essentially shifting the level of an input logic signal to a voltage level compatible with the buffer. The level shifted logic signal then being impressed on the buffer via the emitter follower. The former acting as a voltage follower which produces a substantially similar output and which output is used to drive a large capacitive load. The level shifted logic signal also being used to power gate the buffer during inactive periods.

DESCRIPTION OF THE PREFERRED EMBODIMENT

Figure 1:
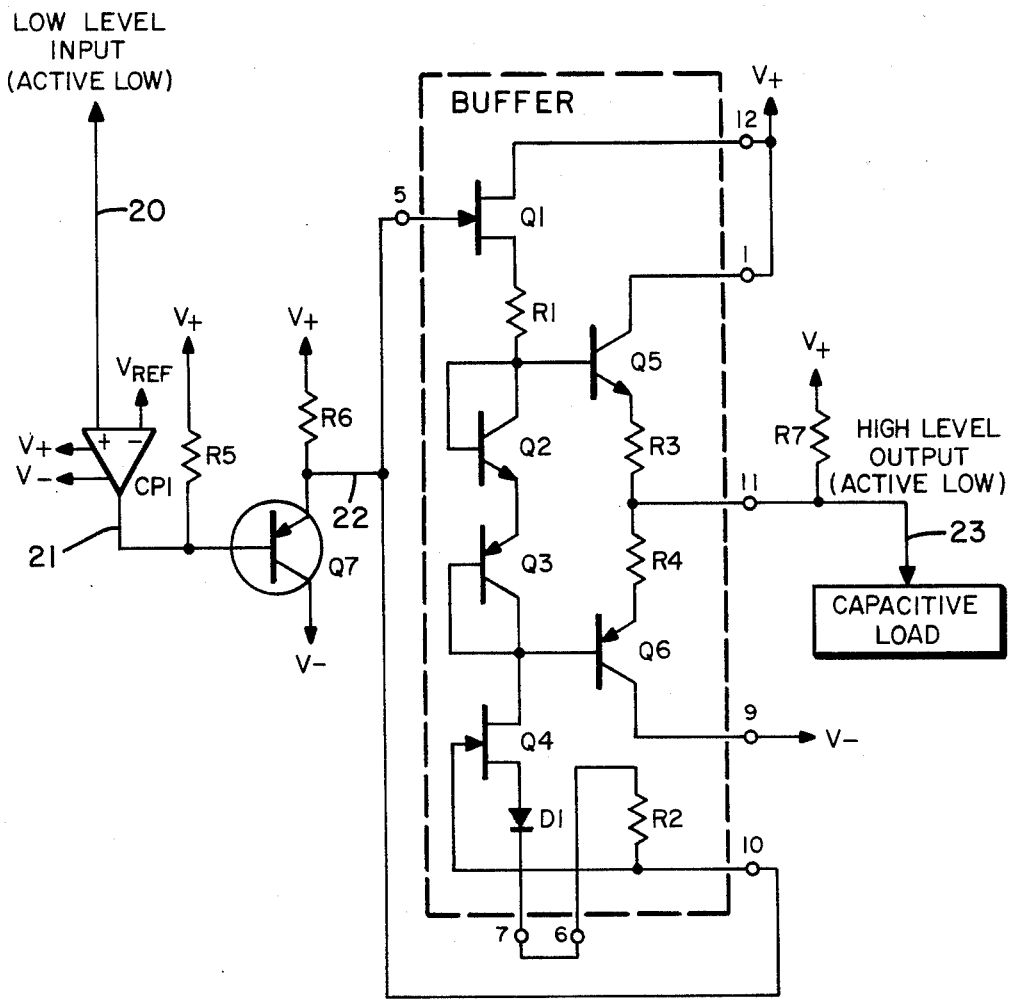
FIG. 1 is a schematic of an active low driver interface circuit wherein a logic low output is active.

Recognizing that the operating principles of the present interface are essentially the same irrespective of whether the output is an active high or an active low, the general operation of the present interface circuit will be described with reference to FIG. 1. Referring to FIG. 1, the present driver interface circuit is comprised of a voltage comparator, an emitter follower and a voltage follower buffer. Upon receipt of an active logic low input on conductor 20, the logic low is impressed on the positive input of the comparator CP1 which is a National Semiconductor, Inc. Part No. LM193. Assuming that the logic low is at TTL levels, the reference voltage $V_{REF}$ is set at 1.5 volts. Any input greater than this level is therefore deemed to be an inactive input, while any input below 1.5 volts is deemed to be an active input. Further, because the voltage comparator CP1 operates between the V+ and a V− voltage levels and because it has an open collector output with pull up resistor R5 connected to V+, the output voltage appearing on conductor 21 will be correspondingly level shifted and will swing between the V+ and V− voltage levels. Therefore an inactive logic high will be indicated by V+ and an active logic low will be indicated by V−.

Once the input logic signal is level shifted via the voltage comparator CP1, it is impressed upon the emitter follower which is comprised of transistor Q7 and resistor R6. The emitter follower possesses a greater current sinking capability than the comparator CP1 and acts to sink the drain current from transistor Q4 in the buffer.

The level shifted logic signal appearing on conductor 22 from the emitter follower is then impressed on terminals 5 and 10 of the buffer which in the preferred embodiment is a National Semiconductor, Inc. Part No. LH0033. The improvement of the present invention being the coupling of the level shifted logic signal on conductor 22 to the terminal 10. Typically terminals 9 and 10 are shorted together and coupled to a negative voltage source. Transistor Q4 then acts as a current source with a drain current of approximately 10 milliamps. This current biases the push-pull output stage comprised of transistors Q5 and Q6 so that approximately 12 milliamps flows in their collectors during the inactive (high) output level. Such a condition, however, is detrimental in the present application since the buffer would always be on and thereby consuming power. Power gating or controlling terminal 10 via a separate logic signal, such that the current path through transistor Q4 and as a result transistors Q5 and Q6 are switched off during inactive periods of the logic signal, however, minimizes the power loss in the buffer. To separately control terminal 10 with a separate logic signal that switches the buffer off during inactive periods would require additional logic circuitry, complicate the design, and require additional power. Instead of utilizing such separate control circuitry, the present invention couples the level shifted logic signal on conductor 22 to terminal 10 and thereby controls the gate and current flowing through transistor Q4 and consequently the collector currents of transistors Q5 and Q6.

Figure 3:
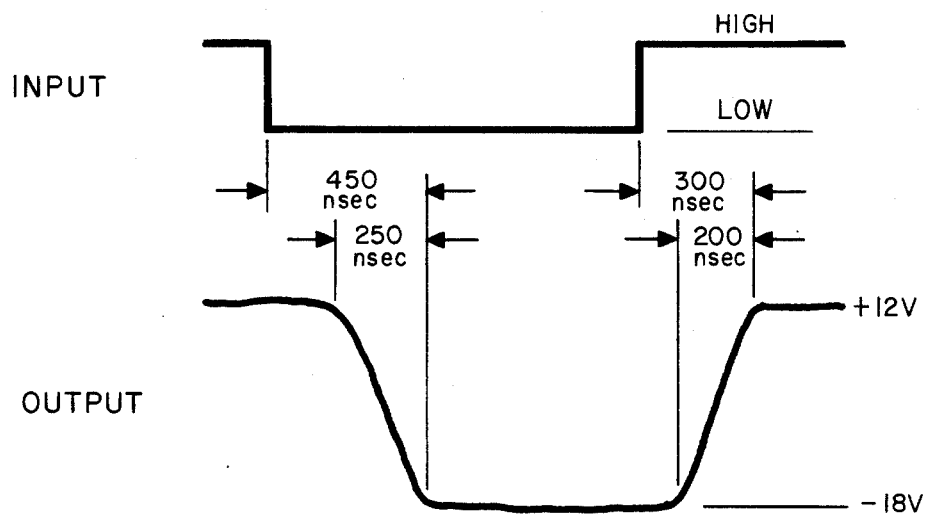
FIG. 3 is a representation of an active low, logic input and the corresponding output waveform for the active low driver of FIG. 1.

Referring to FIG. 3, a typical logic signal that might be impressed on conductor 20 is shown as well as the corresponding output signal that would appear on conductor 23 of the driver interface circuit of the type shown in FIG. 1. Following such a logic signal through the buffer and looking to the affects of the individual levels, it is to be seen that when the logic signal on terminals 5 and 10 and the corresponding gates of transistors Q1 and Q4 is high, transistors Q1 and Q4 are essentially cut-off, since terminals 10 and 12 are coupled to the same potential and which provides an insufficient gate to source voltage to turn them on, thus preventing current from flowing to the bases of transistors Q5 and Q6 and keeping transistors Q5 and Q6 off.

The output signal on conductor 23 is then determined by the level of V+ coupled to resistor R7. In the preferred embodiment V+ is established at a +12 volts DC and V− is established at a −20 volts DC. The output signal will therefore be at a +12 volts.

As the level shifted logic signal switches to its low state, transistors Q1 and Q4 turn on, thus causing current to flow in the path comprised of transistors Q1, Q2, Q3 and Q4. As this current path conducts, base current is supplied to the push-pull output transistors Q5 and Q6 which causes them to conduct and which causes conductor 23 to follow the input on terminal 5 towards V−. As the logic input on terminal 5 continues to switch toward V−, transistor Q5 begins to turn off, and transistor Q6 begins to turn on. Eventually transistor Q5 nears cut-off and transistor Q6 nears saturation which causes conductor 23 to assume a level approaching V−. It is to be noted that because of transistor Q6's base/emitter voltage and because transistor Q6 is never fully saturated, the output on conductor 23 will only come within approximately 2 volts of V− or approximately −18 volts in the preferred embodiment. When the input logic signal again switches toward the V+ level, transistors Q5 and Q6 begin to switch states which causes the output to follow the input toward the V+ level, and at which level transistors Q1 and Q4 will again be turned off. Thus transistors Q5 and Q6 operate in a push-pull fashion, while transistors Q1 and Q4 switch to accommodate the necessary biasing. It is to be noted that transistors Q2 and Q3 are configured as diodes and act to separate and bias the bases of transistors Q5 and Q6 so that they will react to any current change through transistors Q1 and Q4, thus ensuring the push-pull operation of transistors Q5 and Q6.

If, instead, terminals 9 and 10 were shorted together as suggested in the application literature of National Semiconductor, Inc. relative to the LH0033 and were in turn coupled to V−, the current path containing transistors Q1, Q2, Q3, and Q4 would continuously conduct and provide base current to transistor Q5 and Q6. The buffer would consequently consume power during the inactive as well as the active periods.

Whereas power gating the gate of transistor Q4 with the input logic signal turns the transistor Q1 to Q4 and transistor Q5 to Q6 current paths off during the inactive periods and thereby saves power. In fact, it has been determined that approximately 687 milliwatts are consumed in the inactive state by configuring the circuit as suggested by the application literature (i.e. terminals 9 and 10 shorted together and coupled to V−), whereas only approximately 8.6 milliwatts are consumed by using the arrangement of FIG. 1. The present power gating method is also advantageous in that the simultaneous application of the level shifted logic signal to terminals 5 and 10 of the buffer allow the buffer to be on for the minimum possible time, thus consuming minimum power. It is also to be noted that the delays in the waveform of FIG. 3 are primarily due to the switching time of the voltage comparator CP1 and the capacitive loading within the circuit.

Figure 2:
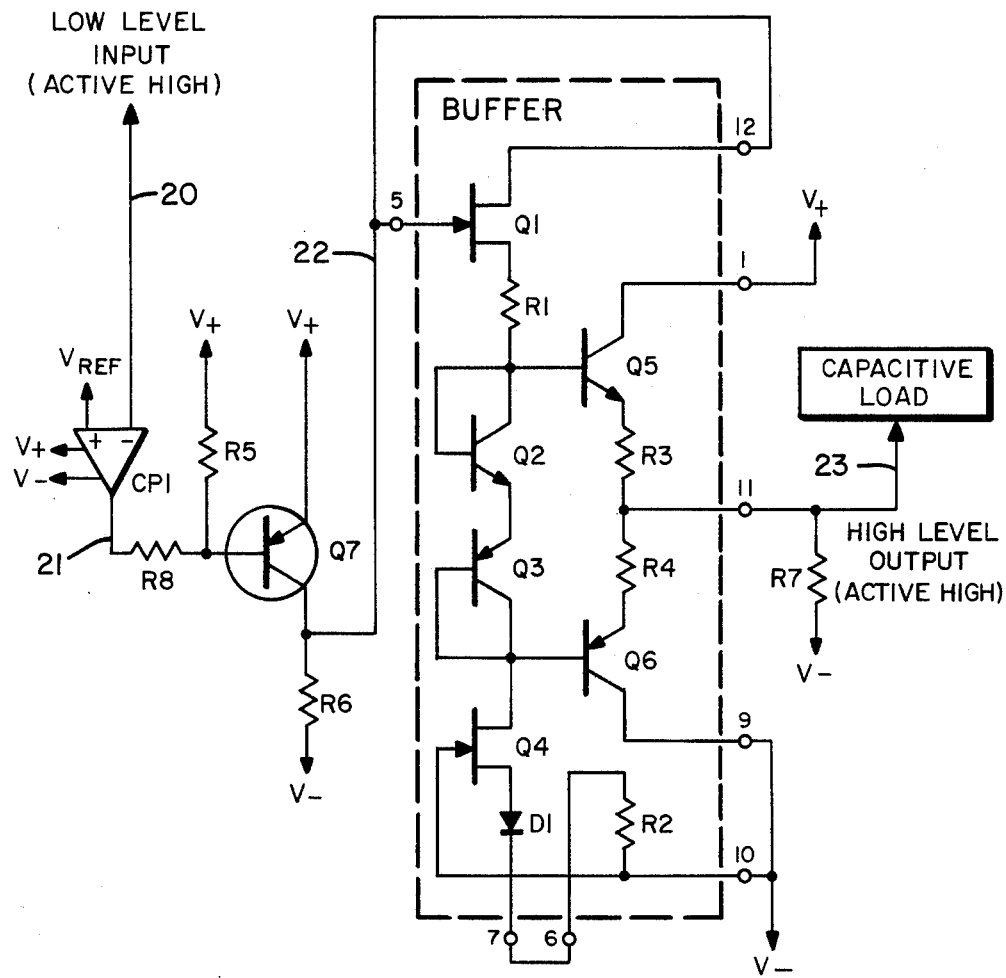
FIG. 2 is a schematic of an active high driver interface circuit wherein a logic high output is active.

Attention is also called to FIG. 2 wherein the counterpart to the above described active low interface is shown. This interface has an active high output condition as opposed to the previously described active low condition. The accomplishment of this end is achieved via the coupling of terminals 9 and 10 to the V− source, the coupling of terminal 1 to the V+ source and the coupling of the terminal 12 to the level shifted input logic signal. This circuit essentially operates the same as the active low circuit, but now the inactive state occurs when the logic signal is at the V− level.

While the present invention has been described with reference to two particular preferred embodiments, it is to be noted that the use of the present power gating scheme can be applied to other types of driver interface circuits, which would be apparent to those skilled in the art. Therefore, the invention should not be construed narrowly but rather within the spirit and scope of the following claims.

What is claimed is:

1. A voltage follower buffer amplifier receiving an input signal into a biasing first stage thereof said amplifier which is connected to a power driving second stage thereof said amplifier, and amplifying said input signal characterized in that said amplifier is also power gated by said input signal in said biasing first stage, said power gated acting to enable said amplifying only upon the transition of said input signal from an inactive to an active logical level, upon the duration of said input signal at said active logical level, and upon the transition of said input signal from said active to said inactive logical level;

whereby said power gated amplifier is not enabled, or disabled, for said amplifying by, and upon, the duration of said input signal at said inactive logical level;

whereby said power gated amplifier, by not being enabled for said amplifying during the duration of said input signal at said inactive logical level does save power during any duration of said input signal of said inactive logical level in comparison to power which would be consumed should said amplifier not be power gated by said input signal for enabling said amplifying.

2. The power gated voltage follower buffer amplifier of claim 1 further characterized in that:

said amplifier is National Semiconductor, Inc. part number LH0033 and said power gated by said input signal as applied to said biasing first stage thereof said amplifier is applied to pin 10, said pin 10 elsewise normally connected to the negative voltage supply V−, thereof said LH0033 device, meanwhile the positive voltage supply V+ being normally connected to pin 12 thereof said LH0033 device;

whereby, since said pin 10 is elsewise normally connected to said negative voltage supply V− but is instead now connected to said input signal, then said biasing first stage, and resultantly said connected power driving second stage, thereof said LH0033 amplifier device will suffice to function for said amplifying only when said input signal is more negative than said positive voltage supply V+;

whereby said LH0033 amplifier device is not enabled, meaning disabled, from said amplifying during the inactive logical level of said input signal which is equal to or more positive than voltage V+.

3. The power gated voltage follower buffer amplifier of claim 1 further characterized in that:

said amplifier is National Semiconductor, Inc. part number LH0033 and said power gated by said input signal as applied to said biasing first stage thereof said amplifier is applied to pin 12, said pin 12 elsewise normally connected to the positive voltage supply V+, thereof said LH0033 device, meanwhile the negative voltage supply V− being normally connected to pin 10 thereof said LH0033 device;

whereby, since said pin 12 is elsewise normally connected to said positive voltage supply V+ but is instead now connected to said input signal, then said biasing first stage, and resultantly said connected power driving second stage, thereof said LH0033 amplifier device will suffice to function for said amplifying only when said input signal is more positive that said negative voltage supply V−;

whereby said LH0033 amplifier device is not enabled, meaning disabled, from said amplifying during the inactive logical level of said input signal which is equal to or more negative than voltage V−.

4. A circuit for interfacing a low voltage, low current drive capacity logic signal which undergoes transistors in level to a large capacitive load requiring a high voltage, high current, drive signal, said circuit comprising:

voltage comparator means for shifting the level of said low voltage, low current drive capacity logic signal to a level-shifted intermediate signal of greater voltage magnitude than said low voltage logic signal; and voltage follower buffer amplifier means responsive to said intermediate signal for producing said high voltage, high current, drive signal WHEREIN said buffer amplifier means are power gated by said intermediate signal for current driving said high voltage, high current, drive signal only during and upon a first-type transition from the inactive level to the active level of said logic signal, plus during the duration of said active level of said logic signal, plus during and upon a second-type transition from said active level to said inactive level of said logic signal;

whereby said voltage follower buffer amplifier means are gated by said intermediate signal for not current driving said high voltage, high current, drive signal during the duration of said inactive level of said logic signal;

whereby that said voltage follower buffer amplifier means do not current drive said high voltage, high current, drive signal during said duration of said inactive level of said logic signal makes that said voltage follower buffer amplifier means do consume less power during said duration of said inactive level of said logic signal than either during said first-type transition from said inactive level to said active level of said logic signal, or during said duration of said active level of said logic signal, or during said second-type transition from said active level to said inactive level of said logic signal.

5. The interfacing circuit of claim 4 wherein said voltage comparator means further comprise:

voltage comparator means and current amplifier means for shifting the level of said low voltage, low current drive capacity logic signal, and for current amplifying said level-shifted said logic signal to produce a current-amplified level-shifted intermediate signal of greater voltage than said low voltage logic signal.

6. The interfacing circuit of claim 4 which further comprises:

resistive pull-up means for supplying current from a voltage supply to said high voltage, high current, drive signal produced by said voltage follower buffer amplifier means, said current being of the direction to sustain the voltage level assumed by said high voltage, high current, drive signal when said logic signal has assumed the inactive level, which does thusly aid to sustain the voltage level of said high voltage, high current, drive signal during that time that said voltage follower buffer amplifier means do not current drive said high voltage, high current, drive signal.

7. The interfacing circuit of claim 6 wherein said low voltage, low current drive capacity logic signal does vary from an inactive voltage level of greater than +1.5 v.d.c. to an active voltage level of less than +1.5 v.d.c.;

said level-shifted intermediate signal does assume a voltage level of approximately +12 v.d.c., corresponding to the inactive level of said logic signal, to a voltage level of approximately −20 v.d.c., corresponding to the active level of said logic signal;

said high voltage, high current, drive signal does assume a voltage level of approximately +12 v.d.c., corresponding to the inactive level of said logic signal, to a voltage level of approximately −18 v.d.c., corresponding to the active level of said logic signal; and said voltage supply is approximately +12 v.d.c.;

whereby said voltage follower buffer amplifier means does current drive said high voltage, high current, drive signal from approximately +12 v.d.c. to −18 v.d.c. during said first-type transition from said inactive level to said active level of said logic signal, plus does current drive said high voltage, high current drive signal at approximately −18 v.d.c. during said duration of said active level of said logic signal, plus does current drive said high voltage, high current drive signal from approximately −18 v.d.c. to approximately +12 v.d.c. during said second-type transition from said active level to said inactive level of said logic signal, but does not current drive said high voltage, high current, drive signal during said duration of said inactive level of said logic signal;

whereby said resistive pull-up means do supply said current to sustain said +12 v.d.c. level assumed by said high voltage, high current, drive signal when said logic signal has assumed said inactive level.

8. The interfacing circuit of claim 6 wherein
said low voltage, low current drive capacity logic
    signal does vary from an inactive voltage level of
    less than +1.5 v.d.c. to an active voltage level of
    greater than +1.5 v.d.c.;
said level-shifted intermediate signal does assume a
    voltage level of approximately −12 v.d.c., corresponding to the inactive level of said logic signal,
    to a voltage level of approximately +20 v.d.c.,
    corresponding to the active level of said logic signal;
said high voltage, high current, drive signal does
    assume a voltage level of approximately −12
    v.d.c., corresponding to the inactive level of said
    logic signal, to a voltage level of approximately
    +18 v.d.c., corresponding to the active level of
    said logic signal; and
said voltage supply is approximately −20 v.d.c.;
whereby said voltage follower buffer amplifier means
    does current drive said high voltage, high current,
    drive signal from approximately −12 v.d.c. to +18
    v.d.c. during said first-type transition from said
    inactive level to said active level of said logic signal, plus does current drive said high voltage, high
    current drive signal at approximately +18 v.d.c.
    during said duration of said active level of said
    logic signal, plus does current drive said high voltage, high current drive signal from approximately
    +18 v.d.c. to approximately −12 v.d.c. during
    said second-type transition from said active level to
    said inactive level of said logic signal, but does not
    current drive said high voltage, high current, drive
    signal during said duration of said inactive level of
    said logic signal;
whereby said resistive pull-up means do supply said
    current to sustain said −12 v.d.c. level assumed by
    said high voltage, high current, drive signal when
    said logic signal has assumed said inactive level.

9. The interfacing circuit of claim 4 wherein said
voltage follower buffer amplifier means further comprise:
    push-pull configuration transistor output stage means
        for producing said high voltge, high current, drive
        signal;
    biasing means responsive to said intermediate signal
        for controlling said output stage means and
        wherein said biasing means are power gated by said
        intermediate signal for causing said transistor output stage means to not current drive said high voltage, high current, drive signal only during said
        duration of said inactive level of said logic signal;
    whereby said voltage follower buffer amplifier means
        does save power during said duration of said inactive level of said logic signal.

10. The interfacing circuit of claim 9 wherein said
biasing means further comprise:
    biasing means responsive to said intermediate signal
        for controlling said output stage means and
        wherein said biasing means are power gated by said
        intermediate signal for causing said transistor output stage means to not current drive said high voltage, high current, drive signal, and for not conducting appreciable current within said selfsame
        biasing means, only during said duration of said
        inactive level of said logic signal;
    whereby power is saved in both said output stage
        amplifier means and in said biasing means during
        the duration of said inactive level of said logic
        signal.

11. A method of controlling a high voltage, high
current driver circuit interfacing a low voltage, low
current drive capacity logic signal, which signal undergoes transitions between two voltage levels, to a capacitive load, said method comprising:
    defining one of said two voltage levels of said logic
        signal as the active level and the other level as the
        inactive level;
    level-shifting said logic signal in a comparator in
        order to produce a level-shifted intermediate logic
        signal of greater voltage magnitude than said low
        voltage logic signal;
    first applying said level-shifted intermediate logic
        signal to said high voltage, high current driver
        circuit for directional drive control in order to
        cause said circuit to directionally drive a high voltage, high current signal into said capacitive load
        directionally responsively to said level-shifted intermediate logic signal; and
    second applying said level-shifted intermediate logic
        signal to said high voltage, high current driver
        circuit for power gating control in order to cause
        said circuit to conditionally drive said high voltage, high current signal only during any transition
        from said inactive level to said active level of said
        logic signal, plus during any duration of said active
        level of said logic signal, plus during any transition
        from said active level to said inactive level of said
        logic signal, and in order to cause said circuit not to
        drive any said high voltage, high current signal
        during any duration of said inactive level of said
        logic signal;
    whereby since said high voltage, high current signal
        into said capacitive load is not driven during any
        duration of said inactive level of said logic signal,
        then said capacitive load does serve to maintain the
        last driven voltage of said high voltage, high current signal;
    whereby power consumption within said high current driver circuit is, during said any duration of
        said inactive level of said logic signal, reduced by
        said power gating contol.

12. The method of controlling a high voltage, high
current driver circuit of claim 11 which further comprises between said level-shifting and said first applying:
    current amplifying said level-shifted intermediate
        logic signal in order that said first applying and said
        second applying may be accomplished at a greater
        current sinking and sourcing capability;
    whereby said current amplifying said directional
        drive control, accomplished by said first applying,
        and said power gating control, accomplished by
        said second applying, of said high voltage, high
        current driver circuit may generally be accomplished faster.

13. The method of controlling a high voltage, high
current driver circuit of claim 11 which further comprises:
    applying a pull-up current from a power source via a
        resistor to said high voltage, high current signal in
        a direction which facilitates the maintenance of
        that voltage to which said high voltage, high current signal is driven upon said any transition from
        said active level to said inactive level of said logic
        signal;
    whereby said pull-up current does additionally serve,
        with said capacitive load, to maintain that last
        driven voltage of said high voltage, high current
        signal during the duration of said inactive level of
        said logic signal.

* * * * *